US00RE40650E

(19) United States
(12) Reissued Patent
Shpater

(10) Patent Number: US RE40,650 E
(45) Date of Reissued Patent: Mar. 10, 2009

(54) INFRARED MOTION DETECTION SIGNAL SAMPLER

(75) Inventor: Pinhas Shpater, Haifa (IL)

(73) Assignee: Shmuel Hershkovitz, Freeport (BM)

(21) Appl. No.: 10/224,631

(22) Filed: Aug. 21, 2002

Related U.S. Patent Documents

Reissue of:
(64) Patent No.: 6,111,256
Issued: Aug. 29, 2000
Appl. No.: 08/831,692
Filed: Apr. 10, 1997

(51) Int. Cl.
*G01J 5/16* (2006.01)
*H03M 1/60* (2006.01)

(52) U.S. Cl. ..... 250/342; 341/157
(58) Field of Classification Search ..... 250/342, 250/341.8; 341/155, 157, 158; 327/101
See application file for complete search history.

(56) References Cited

U.S. PATENT DOCUMENTS 3,319,243 A * 5/1967 Anderson
3,612,901 A * 10/1971 Loe
3,714,470 A * 1/1973 Goldberg
3,781,870 A * 12/1973 Cutsogeorge
4,005,284 A * 1/1977 Rhodes
4,390,796 A * 6/1983 McClenahan et al.
4,468,664 A * 8/1984 Galvin et al. ..... 340/825.69
4,564,821 A * 1/1986 Reichart
4,616,332 A * 10/1986 Robinson et al.
4,638,255 A * 1/1987 Penney
4,736,391 A * 4/1988 Siegel
4,775,841 A * 10/1988 Trofimenkoff et al.
4,980,687 A * 12/1990 Newell et al.
5,077,549 A 12/1991 Hershkovitz et al.
5,189,421 A * 2/1993 Daugherty ..... 341/157
5,659,316 A * 8/1997 Stierli ..... 341/155

FOREIGN PATENT DOCUMENTS

DE 19653566 7/1998
WO WO 98/25349 6/1998

OTHER PUBLICATIONS

Microchip PIC16C62X Data Sheet Manual published 1995.*

* cited by examiner

*Primary Examiner*—Scott J. Sugarman
(74) *Attorney, Agent, or Firm*—Ogilvy Renault LLP

(57) ABSTRACT

The digital sampler circuit processes an output signal from a high gain analog amplifier having as input an infrared motion detector output signal and a negative low pass filtered feedback signal. The amplifier output signal is a substantially square pulse signal having an irregular frequency and duty cycle and has an average duty cycle indicative of a DC level and a slow change in the DC level of the detector output signal. The sampler circuit includes a detector circuit for detecting the amplifier output signal and discriminating at regular intervals a high/low state of the output signal, and generates a high/low feedback signal corresponding to the high/low state of the output signal detected. The high/low state of the output signal is analyzed over a predetermined number of the intervals to obtain a ratio value for producing an output digital signal sample value. The digital sample value is a measure of the DC level and the change in the DC level of the detector output signal. The digital sample is accurate and requires a single comparator and relatively simple circuitry.

27 Claims, 1 Drawing Sheet

INFRARED MOTION DETECTION SIGNAL SAMPLER

Matter enclosed in heavy brackets [ ] appears in the original patent but forms no part of this reissue specification; matter printed in italics indicates the additions made by reissue.

FIELD OF THE INVENTION

The present invention relates to an infrared motion detection digital signal sampler circuit. More specifically, the invention relates to such a sampler circuit integrated in the feedback loop of a high gain analog amplifier for processing an output signal of the amplifier. The amplifier has as input an infrared motion detector output signal and a negative feedback signal. The amplifier output signal is a substantially saturated, substantially square pulse signal having an irregular frequency and duty cycle, and an average duty cycle of the amplifier output signal is indicative of a DC level and a change in the DC level of the motion detector output signal.

BACKGROUND OF THE INVENTION

Passive infrared motion detector are well known in the art. Such detectors typically include a small housing, a lens for directing infrared light from a zone to be monitored onto an infrared sensor element. The most common type of sensor element is a pyroelectric sensor which generates a small but detectable electrical voltage in response to changes in infrared radiation impinging on it. Due to the lens of the known detectors, motion of a person into or from the monitored zone changes the intensity of infrared light striking the sensor and produces a voltage variation. A discriminator circuit monitors the sensor output signal and generates an alarm signal provided that certain characteristics are present in the sensor output signal. Such characteristics may be energy, amplitude peaks, number of oscillations, etc.

An example of the prior art detectors is found in U.S. Pat. No. 5,077,549, co-invented by the inventor of the present invention. It is known from this reference to provide an infrared motion detector circuit which uses a digital logic circuit to discriminate the sensor output signal. The sensor signal amplitude is converted by a voltage controlled oscillator (VCO) to a pulse frequency, and a counter circuit counts pulses to detect the sensor signal's energy and generate the alarm signal.

In the past, the use of a microprocessor along with an analog-to-digital converter (ADC) has been prohibitively expensive for use in a commercially competitive motion detector discriminator circuit. In today's market, various commercially available microcontrollers or microprocessors are inexpensive enough to competitive with standard "hard wired" integrated circuit technology. While the use of a microprocessor improves the flexibility and possible quality of the signal analysis and discrimination, it still requires circuitry for generating a digital signal from the sensor's analog output, such as a high gain bandpass amplifier and an ADC, which represents a significant part of the present cost of the detector circuitry.

SUMMARY OF THE INVENTION

It is an object of the present invention to provide an infrared motion detection digital sampler circuit for processing an infrared sensor output signal to generate digital samples without requiring an analog-to-digital converter. It is a further object of the invention to provide such a digital sampler circuit, integrated in the feedback loop of the bandpass amplifier, which can rely on a microprocessor's capabilities to obtain the desired digital samples by reading the output signal of a high gain analog amplifier having as input the infrared motion detector output signal and a low pass filtered negative feedback signal and providing a control negative feedback signal to the amplifier input. It is a further object of the invention to provide a digital signal processor for an infrared motion detector utilizing a microprocessor and a single operational amplifier.

According to the invention, there is provided an infrared motion detection digital sampler circuit for processing an output signal from a high gain analog amplifier having an input an infrared motion detector output signal and a negative low pass filtered feedback signal, the amplifier output signal being a substantially saturated, substantially square pulse signal having an irregular frequency and duty cycle, an average duty cycle of which is indicative of a DC level and a slow change in the DC level of the detector output signal. The detection circuit comprises means for detecting the output signal and discriminating at substantially regular intervals a high/low state of the output signal; means for generating a high/low feedback signal corresponding to the high/low state of the output signal detected; means for analyzing the high/low state of the output signal detected over a number of the regular intervals to obtain a high/low ratio value and for outputting as a digital signal sample value this ratio value. In this way, the digital signal sample value is a measure of the DC level and the slow change in the DC level of the detector output signal in the desired frequency range of the detector, approximately 0.1 Hz to 10 Hz. Preferably, the analyzing means comprise a digital counter. Alternatively, the output signal can be integrated to obtain an analog value representing the signal sample.

The invention further provides an infrared motion detector signal processing circuit comprising a high gain analog amplifier having an input an infrared motion detector signal and a negative low pass filtered feedback signal, and producing an output signal which is a substantially saturated, substantially square pulse signal having an irregular frequency and duty cycle. The average duty cycle of the square pulse signal is indicative of a DC level and a slow change in the DC level of the motion detector signal. The motion detection circuit further comprises means for detecting the output signal and discriminating at substantially regular intervals a high/low state of the output signal, means for generating a high/low feedback signal corresponding to the high/low state of the output signal detected, and means for analyzing the high/low state of the output signal over a number of the intervals to obtain a high/low ratio value and for outputting as a digital signal sample value the ratio value. In this way, the digital signal sample value is a measure of the DC level and the slow change in the DC level of the detector output signal in the desired frequency range of the detector, approximately 0.1 Hz to 10 Hz.

*According to a second broad aspect of the present invention, there is provided a method for infrared motion detection comprising: providing a microprocessor; providing a motion detector; providing analog circuitry; superposing an ac signal output from said motion detector onto a DC signal to create an input signal; feeding said input signal into said analog circuitry such that a generated output varies between two logic levels; sampling a voltage level of the output in order to obtain digital signal samples; and counting said digital signal samples using said microprocessor.*

*According to a third broad aspect of the present invention, there is provided a method for infrared motion detection*

*comprising: providing a microprocessor; providing a motion detector; providing analog circuitry; superposing an ac signal output from said motion detector onto a DC signal to create an input signal; feeding said input signal into said analog circuitry such that a generated output varies between two logic levels and sampling a voltage level of the output in order to obtain digital signal samples; and analyzing said digital signal samples using said microprocessor.*

BRIEF DESCRIPTION OF THE DRAWING

The invention will be better understood by way of the following detailed description of a preferred embodiment of the invention with reference to the appended drawing in which.

DETAILED DESCRIPTION OF THE PREFERRED EMBODIMENT

Figure 1:
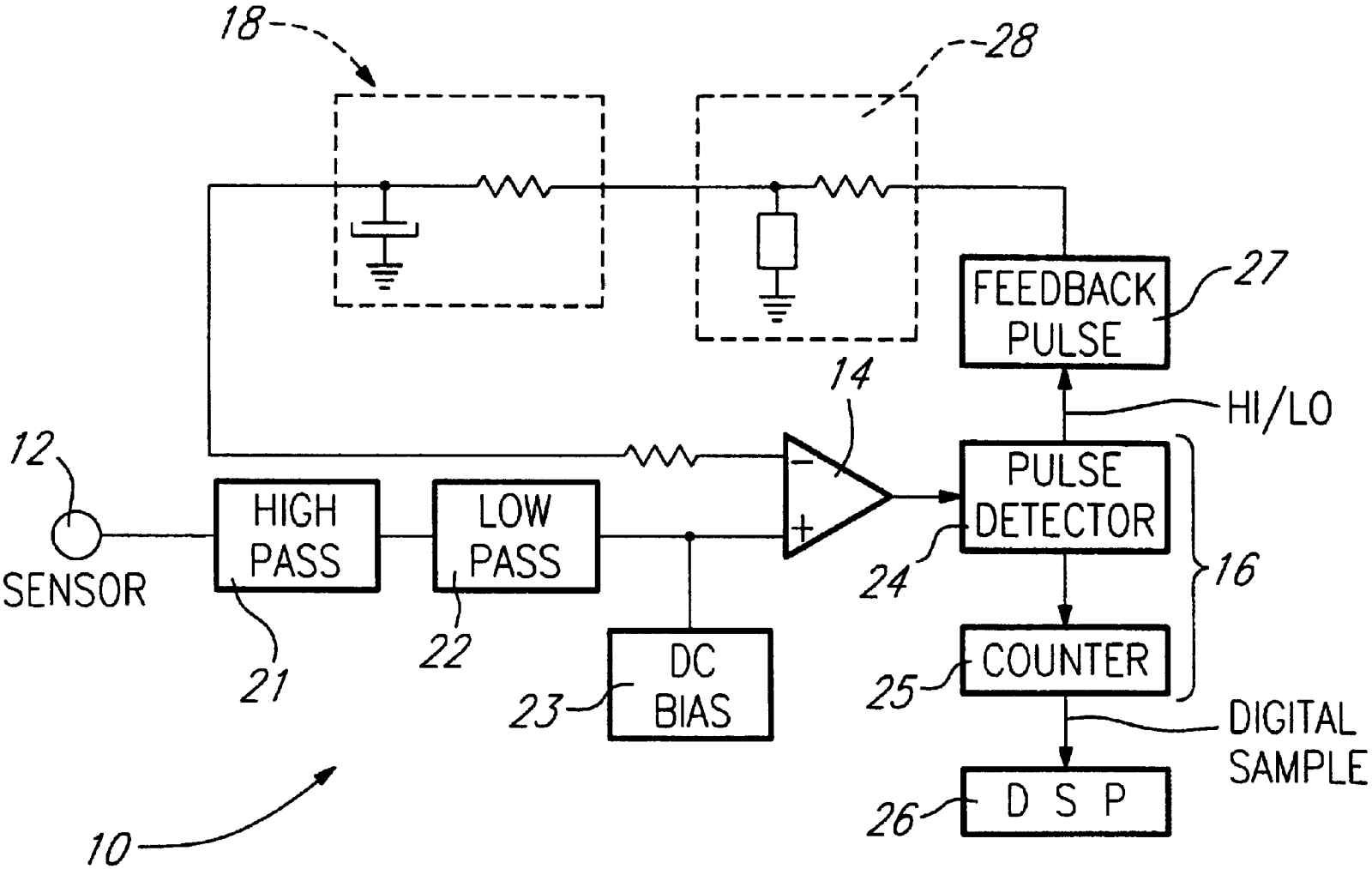
FIG. 1 is a schematic block diagram of the infrared motion detection ampler circuit according to the preferred embodiment.

As shown in FIG. 1, the infrared motion detector 10 according to the preferred embodiment comprises a pyroelectric sensor 12 connected to the positive input of a high gain amplifier 14. The sensor is a Heimann LHI958 pyroelectric sensor. The sensor output signal is filtered by a high pass filter 21 and then a low pass filter 22 and a DC bias reference level 23 is added to the filtered output signal before being connected to amplifier 14. High pass filter 21 has a threshold of 0.2 Hz, and low pass filter 22 has a threshold of 7.0 Hz. The high pass filter is a first order filter, and the low pass filter is a second order filter to eliminate alias. The DC bias level generated by circuit 23 is 1.0V. The gain of amplifier 14 is typically higher than 100000.

The feedback circuit comprises a pulse detector 24 which detects the output of analog amplifier 14 and discriminates the voltage into a low or high signal. The HI/LO digital signal is repeated by a feedback pulse generator 27 and fed back to amplifier 14 via a temperature compensator 28 and an integrator 18. Integrator 18 in the preferred embodiment has a resistance of 1 MΩ and a capacitance of 100 μF. The integrator 18 may also comprise a low pass filter which filters out the high frequency of the amplifier output and passes through the low frequency voltage level present in the amplifier output. The digital signal level is thus reduced below the minimum detectable input signal, i.e. below 1 mV.

The temperature compensation circuit 28 includes a thermistor in a voltage divider arrangement to adjust the feedback voltage and gain in accordance with temperature in order to increase sensitivity as the ambient temperature increases. Increased sensitivity is required at higher temperatures, since the difference between infrared radiation levels emitted by the ambient environment and a person moving through a detection zone decreases with higher ambient temperatures. As a result of temperature compensation, the duty cycle in the pulse train output from the amplifier 14 increases with temperature. The DC level of the feedback voltage fed to amplifier 14 thus changes with temperature as a result of circuit 28. Changes in temperature thus cause a change in the base duty cycle in the amplifier output. By monitoring this base duty cycle, the temperature compensation circuit 28 can also be used to obtain a temperature reading which can be used to change how the digital signal samples are interpreted to generate an alarm signal.

The amplifier 14 is arranged as a non-inverting mode differential amplifier having an output which is a substantially saturated, substantially square pulse signal. Due to the high gain of the amplifier 14, a small difference between the filtered sensor signal and the integrated feedback signal produces a saturated maximum output voltage from the amplifier 14, or a saturated zero output voltage depending on the polarity of the difference. The maximum voltage of the amplifier 14 is set to 5V. The output of amplifier 14 has an average duty cycle proportional to a sum of a change in the DC level at the positive input and the DC level itself. The feedback circuit is designed so as to provide a reliable measurement of millivolt changes in the sensor output. The square pulse signal output of amplifier 14 has an irregular frequency and pulse width. The frequency of the square pulse output of amplifier 14 depends on the circuit loop response and also on the feedback pulse period, but the frequency is not important to obtaining samples. The maximum HI to LO to HI speed can be very high and depends on the loop speed of the circuit components, as well as the rate at which the amplifier output is detected and fed back by generator 27.

The amplifier 14 according to the preferred embodiment is a differentiator amplifier operating in a non-inverting mode, however, an inverting mode differentiator amplifier could also be used. In the case of an inverting mode amplifier, the sensor signal is connected to the negative input along with the feedback with a suitable resistance connected between the integrator and the negative input, and a DC reference voltage is connected to the positive input of the amplifier.

The pulse detector 16 samples at a substantially regular frequency of about 16 kHz. Detector 16 decides whether the analog output of the amplifier 14 is HI (i.e. 5V) or LO (i.e. 0V) and outputs a bit signal. In the preferred embodiment, the pulse detector is part of a microprocessor and detection of the amplifier 14 output is done by reading a digital input signal pin on a regular basis controlled by microprocessor interrupt. Due to the finite gain of amplifier 14, a non-saturated output (i.e. not 5V or 0V) will occur whenever the feedback voltage is very close to the positive input voltage. Such intermediate voltage levels will be randomly interpreted by the discriminator in pulse detector 24, and such random or erroneous interpretation will lead to variations in the feedback and contribute to the pulse train output of amplifier 14 having an irregular, random character.

The counter 25 counts the number of HI pulses ('1' bits) in 255 cycles. The result of the counter gives a single sample which can be stored in one byte of data. The counting and data storage is done in software by the microprocessor in the preferred embodiment. This yields about 62 samples each second, which is more than adequate for analyzing the motion sensor output signal of less than 15 Hz. The digital signal analysis is done in a digital signal processor 26, which in the preferred embodiment is provided by software in the microprocessor.

Since the feedback speed is controlled by the digital sampling and feedback signal generation speed, the output signal from the amplifier will have a maximum switching frequency lower than the feedback signal generation speed, and thus analysis of the high/low state of the amplifier output to obtain the digital signal sample value can be done efficiently at the rate of the feedback signal generation.

The digital samples obtained using the present invention represent a sum of the DC signal and a change in the DC signal input to the amplifier 14. This represents the ratio of the HI to LO state of the amplifier output. As an example, a constant duty cycle of 25% may be present when the amplifier input is constant, i.e. the sensor output is stable at 0V and the DC bias is at its predetermined level. The single byte sample value may be around 64 for a 25% duty cycle. A small change in sensor voltage, namely +2 mV, would only result in a small change in the constant duty cycle, namely it may rise to 25.05%. Thus, the digital sample value having a magnitude of 255 may only change by one digit. However, during the change in input voltage, the duty cycle represents the base DC level plus the rate of change (slope) of the sensor output. A 2 mV change over 0.2 s is a 10 mV/s rate of change which may cause the duty cycle to increase by 5 percentiles to 30% over the 0.2 s period. Likewise a drop in sensor output by 2 mV in 0.2 s would cause the duty cycle to drop by 5 percentiles to 20% during the voltage decline. This results in transition duty cycles that produce easily detectable changes in the digital sample values, e.g. about 15 units.

It will be appreciated that each digital sample results from a simple count or sum of the detected amplifier output voltage level over a sufficiently long period of time to compensate for the random variations in the pulse train and obtain a stable accurate measurement of the change in the output signal from sensor 12.

The analog amplifier may be a differential amplifier, a comparator or a single input amplifier. The analog amplifier can be an external component or an internal integral part of a microcontroller.

Although the invention has been described above with reference to a preferred embodiment, it is to be understood that the above description is intended merely to illustrate the invention and not to limit the scope of the invention as defined in the appended claims.

What is claimed is:

1. An infrared motion detection digital sampler circuit for processing an output signal from a high gain analog amplifier having as input an infrared motion detector output signal and a negative, low pass filtered feedback signal, said output signal being a substantially saturated and substantially square pulse signal having an irregular frequency and duty cycle, an average duty cycle which is indicative of a DC level and a slow change in said DC level of said detector output signal in a desired frequency range of said motion detector output signal, said detection circuit comprising:

means for detecting said output signal and discriminating at substantially regular intervals a high/low state of said output signal;

means for generating a high/low feedback signal corresponding to said high/low state of said output signal detected;

means for analyzing said high/low state of said output signal over a number of said intervals to obtain a high/low ratio value and for outputting as a signal sample value said ratio value, whereby said signal sample value is a measure of said DC level and said change in said DC level of said detector output signal.

2. The circuit as claimed in claim 1, wherein said analyzing means comprises a counter circuit sampling said high/low state at said regular intervals, said ratio value being a digital counter value.

3. The circuit as claimed in claim 1, wherein said detector output signal is connected to a second order low pass filter, whereby alias is substantially eliminated.

4. The circuit as claimed in claim 1, wherein said feedback signal is connected to a temperature compensation circuit.

5. The circuit as claimed in claim 2, wherein said detecting means comprise a microprocessor, said intervals being determined by interrupts, said analyzing means being provided by said microprocessor.

6. The circuit as claimed in claim 5, wherein said predetermined number of intervals is 256 and said signal sample value is stored as one byte.

7. The circuit as claimed in claim 6, wherein a frequency of output of said signal sample value is greater than 30 Hz.

8. The circuit as claimed in claim 1, further comprising filter means for filtering said motion detector output signal, said filter means comprising a high pass filter, a low pass filter and a DC bias.

9. The circuit as claimed in claim 1, wherein said negative feedback signal is passed through an integrator for providing flat frequency response in said desired frequency range of said motion detector output signal.

10. An infrared motion detector signal processing circuit comprising:

a high gain analog amplifier having as input an infrared motion detector output signal and a negative low pass filtered feedback signal, and producing an output signal, said output signal being a substantially saturated, substantially square pulse signal having an irregular frequency and duty cycle, an average duty cycle which is indicative of a DC level and a slow change in said DC level of said motion detector signal in a desired frequency range of said motion detector signal;

means for detecting said output signal and discriminating at substantially regular intervals a high/low state of said output signal;

means for generating a high/low feedback signal corresponding to said high/low state of said output signal detected;

means for analyzing said high/low state of said output signal over a number of said intervals to obtain a high/low ratio value and for outputting as a digital signal sample value said ratio value, whereby said digital signal sample value is a measure of said DC level and said change in said DC level of said detector output signal.

11. The circuit as claimed in claim 10, wherein said analyzing means comprises a counter circuit sampling said high/low state at said regular intervals, said ratio value being a digital counter value.

12. The circuit as claimed in claim 10, wherein said detector output signal is connected to a second order low pass filter, whereby alias is substantially eliminated.

13. The circuit as claimed in claim 10, wherein said feedback signal is connected to a temperature compensation circuit.

14. The circuit as claimed in claim 11, wherein said detecting means comprise a microprocessor, said intervals being determined by interrupts, said analyzing means being provided by said microprocessor.

15. The circuit as claimed in claim 14, wherein said predetermined number of intervals is 256 and said signal sample value is stored as one byte.

16. The circuit as claimed in claim 15, wherein a frequency of output of said signal sample value is greater than 30 Hz.

17. The circuit as claimed in claim 10, further comprising filter means for filtering said motion detector output signal, said filter means comprising a high pass filter, a low pass filter and a DC bias.

18. The circuit as claimed in claim 10, wherein said negative feedback signal is passed through an integrator for providing a flat frequency response in said desired frequency range of said motion detector signal.

*19. A method for infrared motion detection comprising:*

*providing a microprocessor;*

*providing a motion detector;*

*providing analog circuitry;*

*superposing an ac signal output from said motion detector onto a DC signal to create an input signal;*

*feeding said input signal into said analog circuitry such that a generated output varies between two logic levels;*

*sampling a voltage level of the output in order to obtain digital signal samples; and*

*counting said digital signal samples using said microprocessor.*

*20. A method as claimed in claim 19, wherein said providing analog circuitry further comprises providing an amplifier to input an analog signal and a second signal and output a digital signal.*

*21. A method as claimed in claim 20, wherein said second signal is a feedback signal output from said amplifier.*

*22. A method as claimed in claim 21, further comprising integrating said feedback signal to provide a flat frequency response in a desired frequency range of said motion detector output signal.*

*23. A method as claimed in claim 21, further comprising providing a temperature compensation circuit for said feedback signal.*

*24. A method as claimed in claim 19, further comprising filtering said ac signal from said motion detector to substantially eliminate aliasing.*

*25. A method as claimed in claim 19, wherein said counting further comprises counting a predetermined number of intervals determined by interrupts.*

*26. A method as claimed in claim 25, wherein said predetermined number of intervals is 256, and a signal sample value is stored as one byte.*

*27. A method for infrared motion detection comprising:*

*providing a microprocessor;*

*providing a motion detector;*

*providing analog circuitry;*

*superposing an ac signal output from said motion detector onto a DC signal to create an input signal;*

*feeding said input signal into said analog circuitry such that a generated output varies between two logic levels;*

*sampling a voltage level of the output in order to obtain digital signal samples; and*

*analyzing said digital signal samples using said microprocessor.*

* * * * *